US006344737B1

(12) United States Patent
Yap et al.

(10) Patent No.: US 6,344,737 B1
(45) Date of Patent: Feb. 5, 2002

(54) PICKER NEST FOR HOLDING AN IC PACKAGE WITH MINIMIZED STRESS ON AN IC COMPONENT DURING TESTING

(75) Inventors: Thean Loy Yap; Boon Hee Wee, both of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/541,572

(22) Filed: Apr. 3, 2000

Related U.S. Application Data

(62) Division of application No. 08/992,144, filed on Dec. 17, 1997.

(51) Int. Cl.[7] .............................................. G01R 31/02
(52) U.S. Cl. ..................... 324/158.1; 29/25.01; 414/737
(58) Field of Search ............................... 324/158.1, 757, 324/754; 414/737, 627; 29/25.01, 593; 438/14

(56) References Cited

U.S. PATENT DOCUMENTS 5,231,753 A  * 8/1993  Tanaka et al. ................. 29/741
5,574,383 A  * 11/1996  Saito et al. .................. 324/755
5,757,200 A  * 5/1998  Yamashita .................... 324/757
6,099,597 A  * 8/2000  Yap et al. .................... 414/737

* cited by examiner

Primary Examiner—Safet Metjahic
Assistant Examiner—Jimmy Nguyen
(74) Attorney, Agent, or Firm—Monica H. Choi

(57) ABSTRACT

A design for a picker nest which protects any fragile component, such as a bare IC die, mounted on an IC package when the picker nest is holding the IC package for testing. The picker nest of the present invention includes a picker nest head having a picker nest opening with a vacuum suction. The fragile component fits within the picker nest opening as the picker nest is holding the IC package such that no contact force is exerted on the fragile component. The picker nest of the present invention also includes a conductive seal surrounding the perimeter of the picker nest opening for sealing in the vacuum suction within the picker nest opening. The conductive seal is a silicon-based sponge for effectively sealing in the vacuum suction at various temperatures. At least one supporting bar disposed on the picker nest head exerts a force against the IC package substrate toward test contacts of the testing system during testing of the IC package to ensure proper contact of the IC package pins to the test contacts. The conductive seal, the at least one supporting bar, and the picker nest head are comprised of a conductive material to further ensure ESD (Electro Static Discharge) protection for the IC package during testing.

5 Claims, 4 Drawing Sheets

PICKER NEST FOR HOLDING AN IC PACKAGE WITH MINIMIZED STRESS ON AN IC COMPONENT DURING TESTING

This is a divisional of an earlier filed copending patent application, with Ser. No. 08/992,144 filed on Dec. 17, 1997, for which priority is claimed. This earlier filed copending patent application with Ser. No. 08/992,144 is in its entirety incorporated herewith by reference.

TECHNICAL FIELD

This invention relates to integrated circuit package handling systems, and more particularly, to a picker nest design that minimizes stress on an integrated circuit component while the picker nest is holding an integrated circuit package within an integrated circuit testing system.

BACKGROUND OF THE INVENTION

For distribution, an IC (Integrated Circuit) die is mounted within an IC (Integrated Circuit) package. Within such a package, metal leads connect contact pads within the IC die to pins on the IC package. Such pins provide connection from the IC die to other components external to the IC package. To ensure proper packaging of the IC die, the IC package having the IC die mounted thereon is tested. In such testing, the pins on the IC package are coupled to test contacts of a testing system, and various measurements are performed from the test contacts to determine proper IC packaging.

An example of a IC package handler, within an integrated circuit testing system, is the Delta Flex Test Handler, Model 1240, available from Delta Design, Inc., San Diego, Calif. Referring to FIG. 1, such an IC package handling system 100 includes an input mechanism 102, a core unit 104, and an output mechanism 106. The input mechanism 102 carries the IC packages to be tested into the core unit 104 and onto a storage boat 108, already carrying IC packages 110 and 112 in FIG. 1. The storage boat 108 carries the IC packages 110 and 112 until the IC packages reach a desired temperature for testing.

At that point, a core picker assembly 114 picks up an IC package from the storage boat 108 for testing. The core picker assembly includes a picker body 116 and a picker nest 118. The core picker assembly 114 picks up and holds an IC package from the storage boat 108. The core picker assembly then moves the IC package to test contacts 120 such that pins on the IC package make contact with the test contacts 120 for testing of the IC package. The core picker assembly 114 also holds the IC package to the test contacts 120 during testing. The core unit 104 also includes a temperature control unit 122 for adjusting the temperature within the core unit 104 such that the IC package may be tested for various environmental temperatures.

Once the testing of an IC package is complete, the output mechanism 106 includes an output boat 123 which receives the tested IC packages from the core picker assembly 114 after testing and which carries the tested IC packages to a sorting unit 124. When a tested IC package is at the sorting unit 124, each IC package is sorted into a respective bin depending on the results of testing that IC package within the core unit 104. For example, if the result of testing an IC package is performance failure, that IC package is placed into a "bad chip" tube 126, and if the result is performance success, the package is placed into a "good chip" tube 128.

Referring to FIGS. 2A and 2B, the conventional core picker assembly includes a picker nest 200 having a picker head 202 with a single suction cup 204 for picking up and holding an IC package to the test contacts 120 of FIG. 1 during testing. FIG. 2B is a bottom view of the picker nest 200 of FIG. 2A. Such a picker nest with a single suction cup is sufficient for picking up and holding an IC package which has a molding covering the IC die that is mounted on the IC package.

Referring to FIG. 3, such an IC package 300 includes an IC die 302 mounted on a package substrate 304. A molding 306 covers and protects the IC die 302. The suction cup 204 would contact the molding 306 when the core picker assembly is picking up and holding the IC package 300 to the test contacts 120 for testing.

However, IC packages are available in a variety of sizes, shapes, and configurations. For example, the CBGA (Ceramic Ball Grid Array) 360 which is used for packaging the K6 Microprocessor from Advanced Micro Devices, Inc., Santa Clara, Calif., may need testing with a packaging configuration as shown in FIGS. 4A and 4B.

Referring to FIG. 4A, the CBGA 360 package 400 that may need testing includes a bare IC die 402 mounted on a first surface 404 of a ceramic package substrate 406. Capacitors 408, 410, 412, 414, 416, and 418 may be included for coupling to the IC die 402. FIG. 4A shows the first surface 404 of the CBGA 360 package. FIG. 4B shows a second surface 420 of the CBGA 360 package. This second surface 420 includes a grid array 422 of substantially spherical balls that are package pins which couple to circuit pads within the IC die 402. The CBGA 360 package includes a grid array of 19 rows by 19 columns of ball pins. However, the grid array 422 of 4 rows by 4 columns of ball pins is shown in FIG. 4B for clarity of illustration. This grid array of ball pins 422 makes contact with the test contacts 120 of FIG. 1 during testing.

Because of the bare IC die 402 mounted on the package substrate 406, a conventional picker nest 200 with the single suction cup 204 of FIG. 2A may apply unacceptable stress on the die 402 when the core picker assembly is picking up or holding the CBGA 360 package for testing. Moreover, a suction cup of the prior art which typically includes a plastic O-ring or a sponge may not sufficiently seal in the vacuum within the suction cup during testing at lower temperatures such as 0° Celsius to –55° Celsius (or below). However, a package configuration, such as the CBGA 360 package, which includes a bare IC die may be desirable for some integrated circuits, and such a package may still need testing at various temperatures.

SUMMARY OF THE INVENTION

Accordingly, a primary object of the present invention is to pick up and hold such an IC package having a fragile integrated circuit component, such as a bare IC die, mounted thereon without inducing unacceptable stress on the fragile component during IC package testing at various temperatures.

In a general aspect of the present invention, a picker nest which holds the IC package for testing includes a picker nest head having a picker nest opening with vacuum suction for holding the IC package. The dimensions of the picker nest opening are larger than the dimensions of the fragile component such that the fragile component fits within the picker nest opening when the picker nest is holding the IC package. In addition, a conductive seal disposed on the picker nest head and disposed outside the perimeter of the picker nest opening seals the vacuum suction within the picker nest opening.

Furthermore, at least one supporting bar disposed on the picker nest head supports the package substrate against the picker nest head when the picker nest is holding the IC package.

The present invention can be used to particular advantage when the picker nest head and the at least one supporting bar are comprised of aluminum. In that case, the picker nest head and the supporting bar provide ESD (Electro Static Discharge) protection for the IC package during testing. The conductive seal which seals the vacuum suction within the picker nest opening may be a silicon-based sponge to ensure sufficient vacuum seal at lower temperatures.

Such a picker nest does not induce contact force on the fragile component mounted on the IC package since the fragile component fits within the picker nest opening when the picker nest is holding the IC package. Thus, the present invention is particularly amenable for holding an IC package such as the CBGA 360 package that has a bare IC die mounted on the package substrate.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Moreover, elements having the same reference numeral in FIGS. 1–8 refer to the same element.

DETAILED DESCRIPTION

Figure 1:
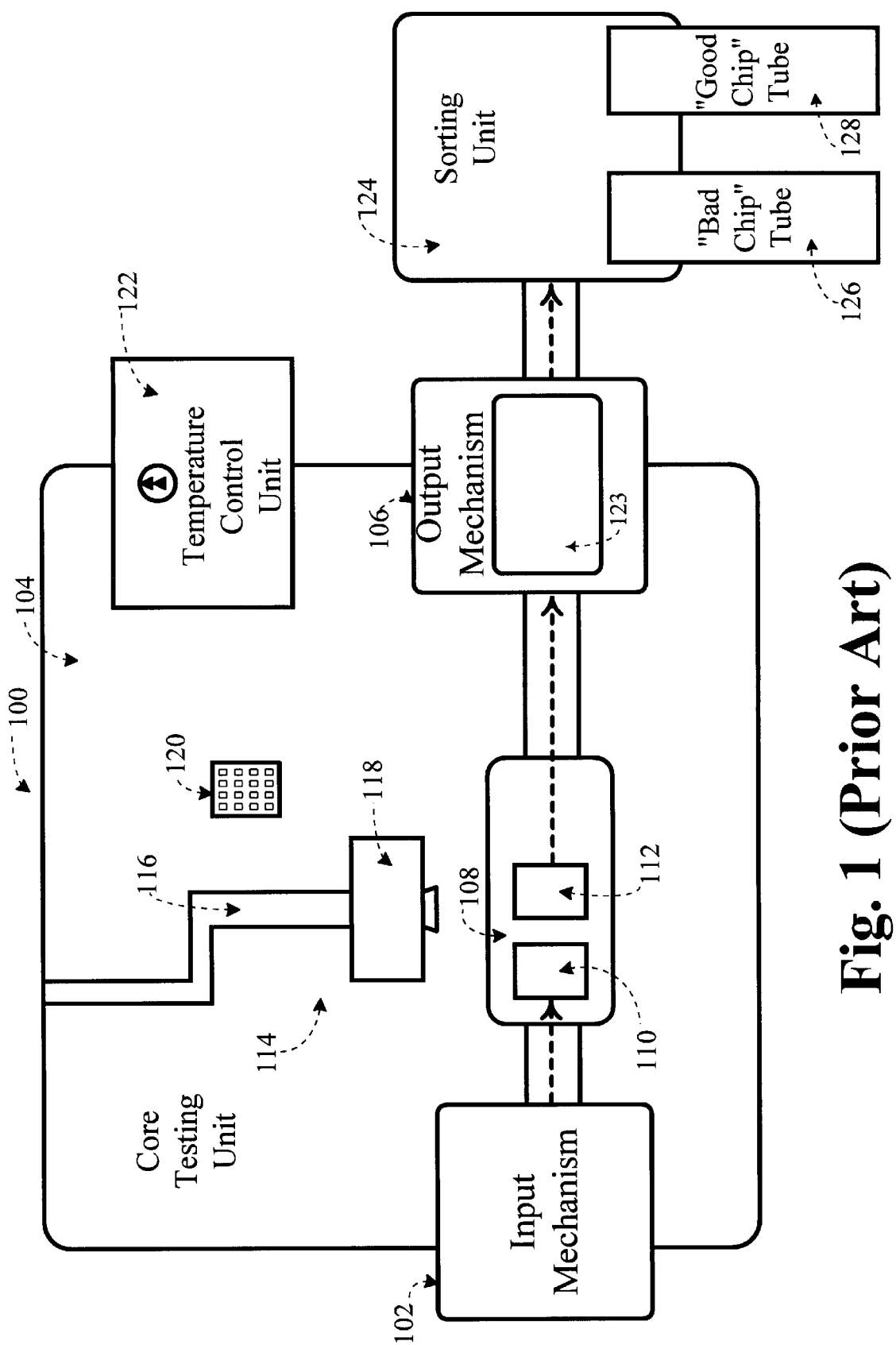
FIG. 1 shows the components of an IC package handler within an integrated circuit testing system.
Figure 2A:
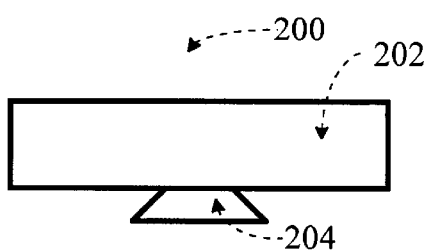
FIG. 2A shows a side view of a prior art picker nest head.
Figure 2B:
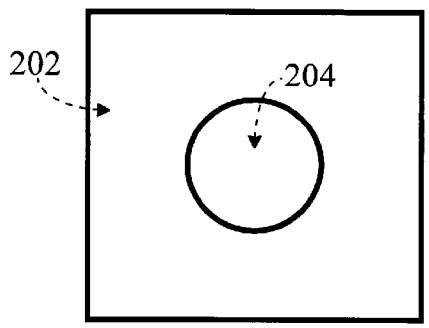
FIG. 2B shows the bottom view of the prior art picker nest head of FIG. 2A.
Figure 3:
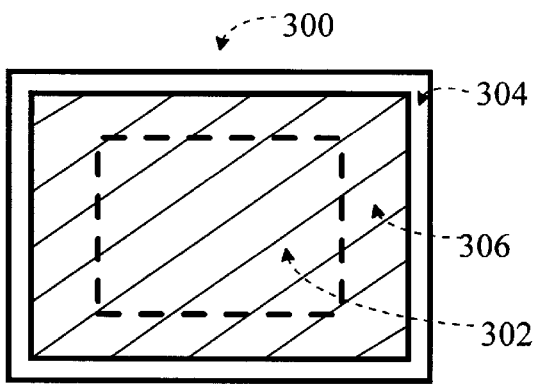
FIG. 3 shows a first type of IC package that includes a molding covering the IC die mounted on the IC package.
Figure 4A:
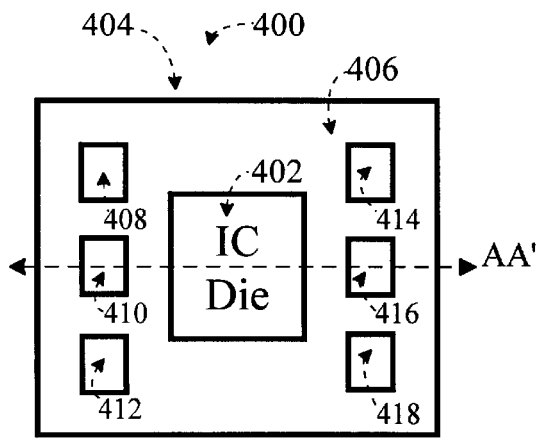
FIGS. 4A and 4B show a second type of IC package that has a bare IC die mounted on a first surface of the IC package and that has a grid array of ball pins on a second surface of the IC package.
Figure 4B:
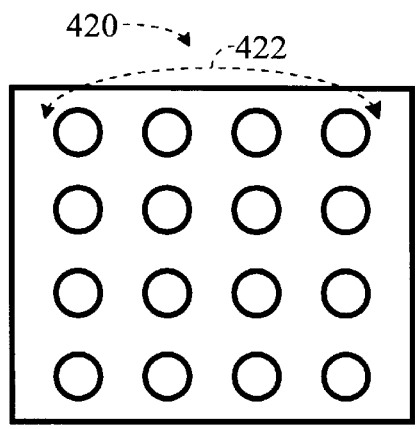
Figure 5:
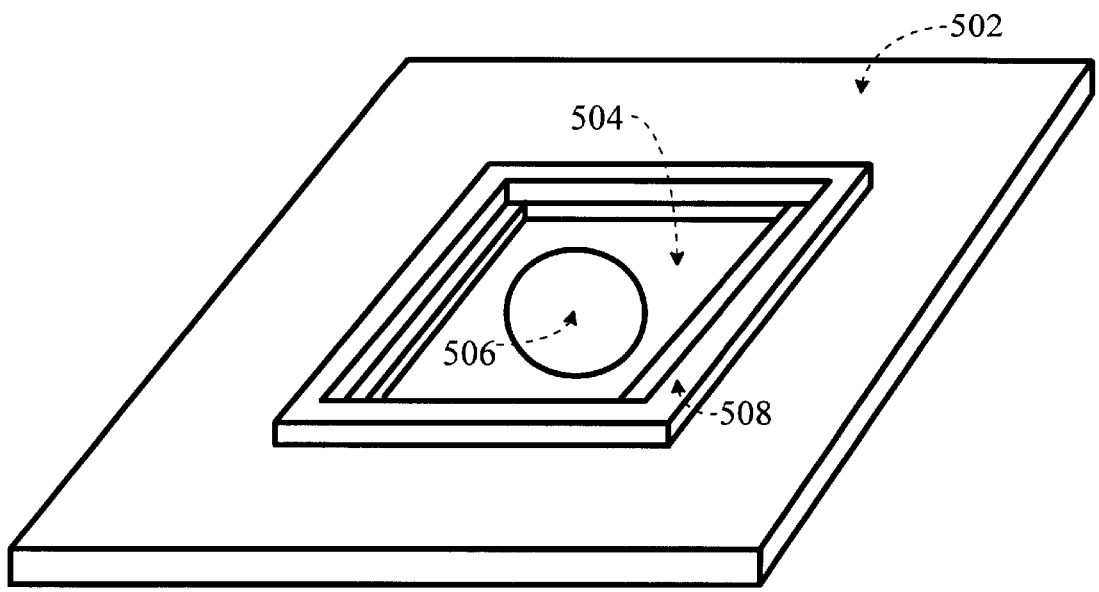
FIG. 5 shows a picker nest head including a picker nest opening with vacuum suction, according to a preferred embodiment of the present invention.

Referring to FIG. 5, the picker nest design according to a preferred embodiment of the present invention includes a picker nest head 502 having a picker nest opening 504. This picker nest head 502 is further mounted as part of the picker nest 118 within the IC package handling system 100 of FIG. 1. The picker nest opening 504 includes a vacuum suction hole 506 at a bottom wall of the opening 504. This vacuum suction hole 506 is a source of vacuum suction within the opening 504. A conductive seal 508 is disposed on the picker nest head 502 and is disposed outside the perimeter of the picker nest opening 504.

Figure 6:
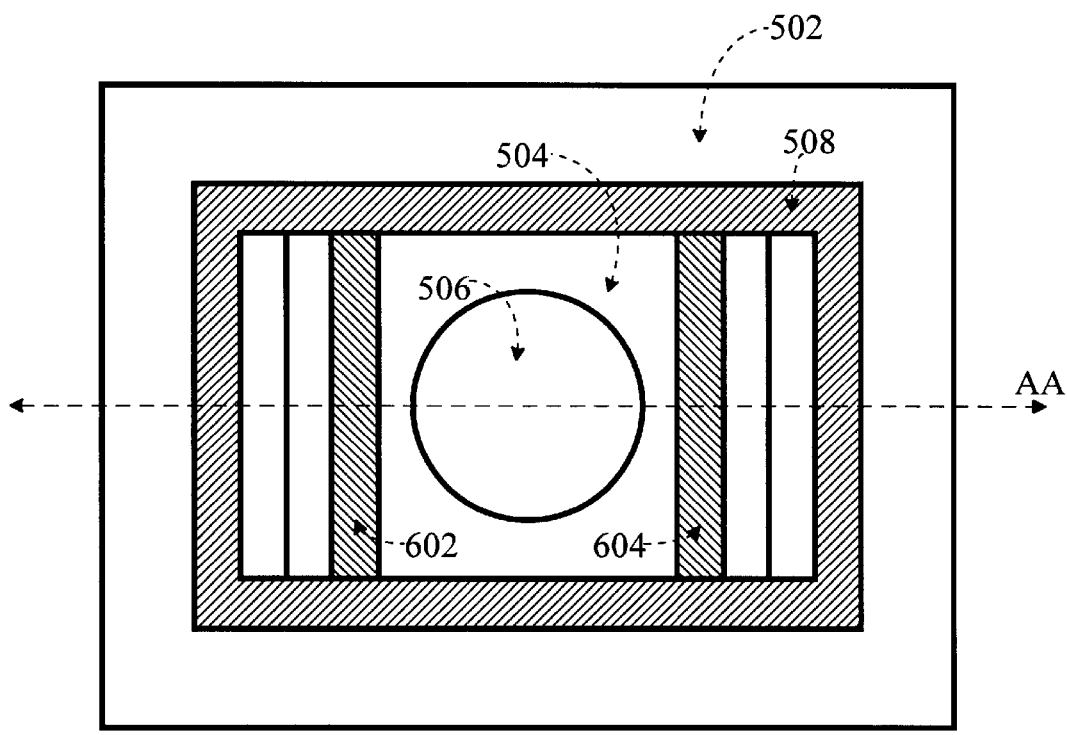
FIG. 6 shows a top view of the picker nest of FIG. 5 further including supporting bars within the picker nest opening, according to a preferred embodiment of the present invention.
Figure 7:
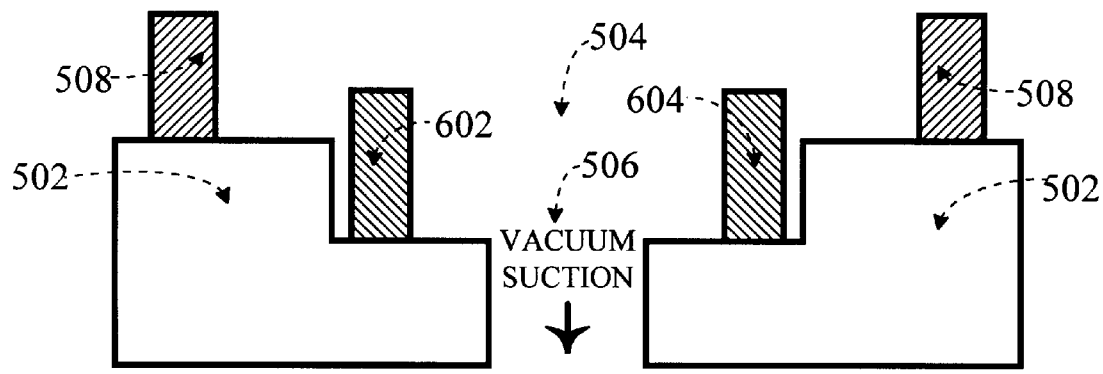
FIG. 7 shows a cross sectional view of the picker nest of FIGS. 5 and 6, according to a preferred embodiment of the present invention.

Referring to FIG. 6, a top view of the picker nest of FIG. 5 is shown. In addition to the picker nest head 502, the picker nest opening 504, the vacuum suction hole 506, and the conductive seal 508 of FIG. 5, two supporting bars 602 and 604 are disposed within the picker nest opening 504. Elements having the same reference numeral in FIGS. 5 and 6 refer to the same element. (Note, the two supporting bars 602 and 604 were not included in the picker nest opening 504 of FIG. 5 for clarity of illustration.) Referring to FIG. 7, a cross-sectional view of the picker nest head of FIGS. 5 and 6 across the line AA in FIG. 6 is shown. Note the picker nest head 502 includes the picker nest opening 504 which includes the vacuum suction hole 506 at the bottom wall of the picker nest opening 504. The conductive seal 508 is disposed outside the perimeter of the picker nest opening 504, and the two supporting bars 602 and 604 are disposed inside the picker nest opening 504. Note also that the total height of the supporting bars 602 and 604 does not reach the top of the conductive seal 508 in a preferred embodiment of the present invention.

The operation of the picker nest including the picker nest head of FIGS. 5–7 is now described with reference to FIGS. 1, 4A, 4B, and 8. The picker nest head of FIGS. 5–7 is disposed on the core picker assembly 114 in the IC package handling system 100 of FIG. 1 for picking up and holding an IC package during testing of that IC package. The picker nest design of FIGS. 5–7 is especially amenable for testing an IC package, such as the CBGA 360 package of FIG. 4A, that has a fragile component, such as the bare IC die 402, mounted on the package substrate 406.

When the picker nest head of FIGS. 5–7 is picking up such an IC package, the picker nest opening 504 covers the bare IC die 402 mounted on the package substrate 406. For example, when this picker nest head 502 is picking up or holding the IC package 400 of FIG. 4A, the picker nest opening 504 is disposed on the first surface 404 of the IC package 400 of FIG. 4A. For instance, referring to FIGS. 4A and 6, the line AA along picker nest head 502 may be aligned with line AA' along the IC package 400.

Figure 8:
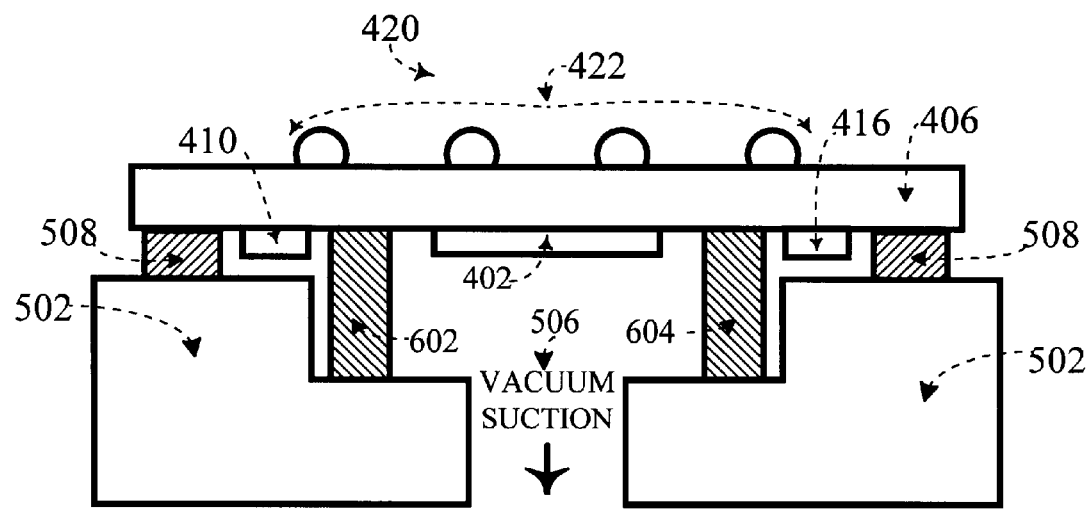
FIG. 8 shows the cross sectional view of FIG. 7 when the picker nest is holding an integrated circuit package, according to a preferred embodiment of the present invention.

FIG. 8 shows the cross-sectional view of the picker nest head 502 holding the IC package 400 along line AA of the picker nest head 502 and along line AA' of the IC package 400. Note that elements having the same reference numeral in FIGS. 4–8 refer to the same element.

Referring to FIG. 8, the bare IC die 402 fits within the picker nest opening 504 such that no contact force is exerted on the IC die 402. The dimensions of the picker nest opening 504 are greater than the dimensions of the IC die 402. Furthermore, the supporting bars 602 and 604 are disposed sufficiently far apart from each other such that the IC die 402 fits between the supporting bars 602 and 604. In a preferred embodiment of the present invention, note that the capacitors 410 and 416 are disposed between the supporting bars 602 and 604 and the conductive seal 508. Such relative positions minimize the adverse effect that may be caused by a direct force on the capacitors 410 and 416.

The vacuum suction within the opening 504 allows the picker nest head 502 to hold the IC package 400. The conductive seal 508 which surrounds the outside of the perimeter of the picker nest opening 504 seals in the vacuum suction within the picker nest opening 504. As the IC package 400 is held against the picker nest head 502, the conductive seal 508 is compressed down from the uncompressed state of FIG. 7 (when the picker nest head 502 is not holding an IC package). In a preferred embodiment of the present invention, the conductive seal 508 is a silicon-based sponge. Such a conductive seal makes contact with the IC package substrate 406 when the picker nest head 502 is holding the IC package 400.

Charge build-up on the seal 508 may induce charge build-up on the IC package when the seal 508 makes contact with the IC package which may cause damage to the IC die 402. A seal that is conductive ensures a minimization of charge build-up on the seal thus ensuring less risk of damage to the IC die 402 for ESD (Electro Static Discharge) protection.

Moreover, a silicon-based sponge is used for the conductive seal 508 because a silicon-based sponge is amenable for lower temperatures of 0° Celsius to −55° Celsius (or below). Other types of seals such as rubber rings or other types of sponges may harden at such lower temperatures and not adequately seal in the vacuum within the picker nest opening.

The supporting bars 602 and 604 within the picker nest opening 504 support the IC package substrate 406 against the picker nest head 502. With such a support, the silicon-based sponge 508 is less prone to wearing fatigue. Without the supporting bars 602 and 604, the silicon-based sponge 508 may be subject to more compression force as the vacuum suction within the picker nest opening 504 pulls the IC package 400 toward the picker nest head 502.

In addition, the supporting bars 602 and 604 exert a force counter to the vacuum suction toward the IC package 400. This counter-force is important in ensuring that the grid array of ball pins 422 on the second surface 420 of the IC package 400 makes sufficient contact with the test contacts 124 within the testing system 100 of FIG. 1. The core picker assembly 114 includes the picker nest of FIGS. 5–8 holding the IC package 400 for testing. The core picker assembly 114 holds the IC package 400 to the test contacts 120 during testing. The grid array of ball pins 422 on the second surface 420 of the IC package may require sufficient contact with the test contacts 120 for proper testing. The supporting bars 602 and 604 exert a force against the IC package substrate 406 further ensuring that the ball grid array pins make sufficient contact with the test contacts 120. Without the supporting bars 602 and 604, only the silicon-based 508 sponge supports the package substrate 406 and may not exert sufficient force for proper contact of the grid array of ball pins 422 to the test contacts 120.

In a preferred embodiment of the present invention, the supporting bars 602 and 604 and the picker nest head 502 are comprised of a conductive material such as aluminum. Charge build-up on the supporting bars 602 and 604 and the picker nest head 502 may induce charge build-up on the IC package when the picker nest head 502 makes contact with the IC package which may cause damage to the IC die 402. Supporting bars and a picker nest head that are conductive ensure a minimization of such charge build-up and thus less risk of damage to the IC die 402 for ESD (Electro Static Discharge) protection.

In this manner, the picker nest design of the present invention is especially amenable for testing IC packages, such as the CBGA 360 package, which may need testing with a fragile component, such as a bare IC die, mounted thereon. Because a picker nest opening houses the bare IC die, no direct contact force is exerted on the bare die further ensuring against damage of the bare IC die during testing. Moreover, the picker nest design of the present invention using a silicon-based sponge for the conductive seal 508 is amenable for testing of IC packages at lower temperatures of 0° C. to −55° C. (or below) because such a sponge has relatively less hardening at such low temperatures.

The foregoing is by way of example only and is not intended to be limiting. For example, the advantageous features of the present invention may be used in conjunction with any IC package having a fragile component mounted thereon which requires protection against contact force during testing of the IC package. The IC package configuration described herein is by way of example only, and the present invention may be used with IC packages having different pin structures than the grid array of ball pins. In addition, the size and shape of the picker nest of the present invention may vary to accommodate the various sizes and shapes of different IC packages. For example, the picker nest opening may have a round shape instead of a rectangular shape.

Moreover, it is to be understood that terms and phrases such as "top of" and "bottom wall" as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for picking up and holding an integrated circuit package to test contacts within an integrated circuit testing system, the method including the steps of:

placing a picker nest head onto a first surface of the integrated circuit package having a fragile integrated circuit component mounted on said first surface of said integrated circuit package, wherein said fragile integrated circuit component is exposed on said first surface of said IC package, and wherein the picker nest includes an opening that fits over the fragile integrated circuit component;

generating a vacuum suction through said picker nest opening;

sealing the vacuum suction within the picker nest opening with a conductive seal disposed on the picker nest head and disposed outside the perimeter of the picker nest opening, wherein said conductive seal contacts said first surface of said integrated circuit package and is disposed to surround said fragile integrated circuit component when said picker nest head is placed onto said first surface of said integrated circuit package; and moving the picker nest holding the integrated circuit package until integrated circuit pins on the integrated circuit package make contact with test contacts of the testing system.

2. The method of claim 1, wherein at least one supporting bar disposed on the picker nest head contacts and pushes against said first surface of said integrated circuit package when the picker nest is holding the integrated circuit package with said vacuum suction to exert an force on the integrated circuit package against the test contacts.

3. The method of claim 2, wherein the picker nest head and the at least one supporting bar are comprised of aluminum.

4. The method of claim 1, wherein the conductive seal is a silicon-based sponge that is compressed against said first surface of said integrated circuit package when said picker nest is holding the integrated circuit package with said vacuum suction.

5. The method of claim 1, wherein the integrated circuit package is a ball grid array package, and wherein the fragile integrated circuit component is a bare integrated circuit die mounted on said first surface of the integrated circuit package, and wherein a grid array of ball pins is mounted on a second surface of the integrated circuit package.

* * * * *